United States Patent [19]

Liu et al.

[11] Patent Number: 4,817,652
[45] Date of Patent: Apr. 4, 1989

[54] SYSTEM FOR SURFACE AND FLUID CLEANING

[75] Inventors: Benjamin Y. H. Liu, North Oaks; Kang H. Ahn, Minneapolis, both of Minn.

[73] Assignee: Regents of the University of Minnesota, Minneapolis, Minn.

[21] Appl. No.: 30,895

[22] Filed: Mar. 26, 1987

[51] Int. Cl.$^4$ ............................................. B08B 3/10
[52] U.S. Cl. .................................. 134/102; 422/113; 422/230; 422/231
[58] Field of Search ...................... 134/94, 99, 102, 36; 68/183; 422/113, 230, 231; 261/121.1, DIG. 26

[56] References Cited

U.S. PATENT DOCUMENTS

| | | | |
|---|---|---|---|
| 1,097,099 | 5/1914 | Kalkow | 422/113 X |
| 1,409,588 | 3/1922 | Runge | 422/231 X |
| 1,907,455 | 5/1933 | Stenzel | 422/231 X |
| 2,009,278 | 7/1935 | Smidel | 148/8 |
| 3,166,445 | 1/1965 | Enemark et al. | 134/31 |
| 3,410,724 | 11/1968 | Kondrot | 134/22 |
| 3,655,172 | 4/1972 | Ingels | 422/113 X |
| 3,733,710 | 5/1973 | Kearney et al. | 34/9 |
| 3,799,179 | 3/1974 | Thomas | 134/102 X |
| 4,226,642 | 10/1980 | Baran | 134/102 X |
| 4,266,982 | 5/1981 | Bender et al. | 134/18 |
| 4,305,413 | 12/1981 | Dougherty | 134/102 X |
| 4,628,616 | 12/1986 | Shirai et al. | 34/78 |

FOREIGN PATENT DOCUMENTS

| | | |
|---|---|---|
| 57-204132 | 12/1982 | Japan . |
| 58-141527 | 8/1983 | Japan . |
| 60-165727 | 8/1985 | Japan . |
| 61-018958 | 1/1986 | Japan . |
| 61-060799 | 3/1986 | Japan . |
| 61-131459 | 6/1986 | Japan . |
| 62-173720 | 7/1987 | Japan . |
| 62-195129 | 8/1987 | Japan . |
| 63-010529 | 1/1988 | Japan . |

*Primary Examiner*—Philip R. Coe
*Attorney, Agent, or Firm*—Merchant, Gould, Smith, Edell, Welter & Schmidt

[57] ABSTRACT

A cleaning system of the apparatus utilizing the effect of surface tension forces (4) and phase changes between a liquid and gas. In one embodiment the surface (21) to be cleaned is submerged within a vessel (30), the pressure within the vessel being increased. A rapid depressurization of the vessel causes a plurality of bubbles (12) to form around undesired particulate matter (13) on the surface (14) of the article to be cleaned, the bubbles rising to the surface of the liquid (27) within the chamber, thereby cleaning the article. A second embodiment utilizes a cleaning fluid (52) which is applied to the surface of the article (49) to be cleaned. The fluid being subsequently frozen on the surface, thereby reducing the adhesion force between the surface of the article and undesired particulate matter. The surface of the article (49) is subsequently heated, and the undesired particulate matter is removed through the medium of the cleaning fluid (52).

7 Claims, 3 Drawing Sheets

SYSTEM FOR SURFACE AND FLUID CLEANING

BACKGROUND OF THE INVENTION

1. Field of the Invention

This application relates to new and novel methods for cleaning both surfaces and liquids. More particularly, the present invention concerns methods of removing small particulate matter from surfaces, and from fluids in which such particles may be suspended.

2. Description of Related Technology

Cleaning techniques are as varied as the contaminates and media to be cleaned. Precision cleaning has taken on great importance in recent years due to the necessity in certain fields, such as computer disks and integrated circuit manufacture, where the removal of microscopic particulate matter is essential to assure the basic efficacy of the device or manufacturing process. For example, in the manufacture of silicon wafers as used in the integrated circuit industry, a rejection rate of 20 to 30 percent can be caused solely by the presence of particulate matter on the surface of the wafers.

Various methods have been employed in the field of precision cleaning, including ultrasonics, megasonics, wiping, brush scrubbing, low pressure surfactant spraying, high pressure jet spraying, etching and centrifugal spraying. Each of these methods will now be briefly discussed.

In ultrasonic cleaning, a part is immersed in a suitable liquid medium and sonicated or agitated at a high frequency (18 to 120 kilohertz). This usually lasts for several minutes, and then the part is rinsed and dried. Cavitation occurs when microscopic bubbles form in the liquid medium and then violently collapse or implode, mechanically scouring the part to be cleaned and displacing and loosening the contaminants. There are many advantages to ultrasonic cleaning. It is fast, effective and safe to use. It requires less heat than other cleaning methods, and when used properly it can vigorously clean delicate parts without harming surface finishes. Also, there is no need to dismantle assemblies. Disadvantages of ultrasonic cleaning include its complexity and the generation of noise. In fact, ultrasonic cleaning makes so much noise at frequencies lower than 20 kilohertz that a 40 kilohertz frequency is recommended even though it is less efficient.

Megasonic cleaning is another cleaning method which consists of basically the same steps as ultrasonic cleaning: immersion, agitation or sonication, rinsing and drying. The major difference between the two is that while ultrasonic frequencies range from 18 to 120 kilohertz, megasonic frequencies are in the range of 0.8 to 1 megahertz with input power densities ranging from 5 to 10 watts per centimeter. Whereas the cleaning action in ultrasonic cleaning comes from cavitation, the cleaning action in megasonic cleaning comes from high pressure waves pushing and tugging at contaminants lodged on a part's surface. There are many advantages to megasonic cleaning. It causes almost no scratches, breakage or chipping since substrates are not transferred or subjected to any mechanical stress. It is three to four times more productive than scrubbing or chemical cleaning at an equal or lower investment cost and produces superior wafer cleanliness. Megasonic cleaning consumes only about ⅛ the amount of chemical solvents when compared to conventional chemical cleaning, and megasonic cleaners have low maintenance and are simpler to automate. Megasonic cleaners are also able to use more chemically active cleaning solutions such as hydrogen peroxide and amonium hydroxide.

Megasonic cleaning also has some disadvantages. For example, the solvent system must be adapted to the particular contaminant-substrate bonding and the transducer matrix is not a commercial item. Cleaning solutions such as strong hydrofluoric acid cannot be used, and a substrate container must be designed to minimize obstruction to the megasonic beam.

Although it may not be as efficient as sonic cleaning, wiping is another successful cleaning method. It is an inefficient but effective method of particle removal that is commonly used to clean optical surfaces. Besides the amount of time it takes, a major drawback to wiping is that particles can be deposited from the tissue or the solvent being used. Wiping is also unable to reach irregular surface geometries and the results depend on the wiper's skill and attention to detail.

A related method of cleaning is brush scrubbing. In the brush scrubbing method, the brush never actually touches the surface being cleaned due to the hydrophilic nature of the brush. There is always the film of the scrubbing solution between the brush and the surface. The hydrophilic brush will only remove contaminants from hydrophobic surfaces. Surfaces that are hydrophilic are more difficult to clean because suspended contaminants can precipitate onto them. There are several factors which contribute to making brush scrubbing ineffective. First, the aqueous neutral detergent solutions used with scrubbers can leave behind thin nylon films. When used with chemically active cleaning solutions, rapid corrosion can occur. If this is true, chemical cleaning is then also required, and this inevitably introduces more particles. Another problem can arise when brushes become infested with dirt particles and debris from surface breakage or chipping. When this happens, the brushes themselves can become sources of contamination and scratches. Finally, scrubbers are sequential in operation and can only clean one part, and often only one side, at a time.

Unlike brush scrubbing, low pressure surfactant spraying relies on chemical means to remove particles. Its success depends on the effectiveness of the detergent that it sprays. The pressure of the jet itself, which can vary from 5 psi to 80 psi, is not nearly enough by itself to remove particles. Therefore, the compatability of the detergent with the contaminant and the surface is crucial. Detergents are surfactants which function by reducing the surface tension of water. They remove soils through emulsification and by concentrating at water interfaces. At high concentrations, detergent solutions form micelles. Micelles occur when the detergent carbon chain forms a low polarity region that is stabilized by having the polar ends in contact with the water. The cleansing action occurs because the lowered water surface tension allows the detergent to penetrate and the micelles to dissolve greases and oils by taking them into the carbon regions.

High pressure jet cleaning operates under very different principles than surfactant spraying. It works when the shear force it exerts is greater than the adhesion force holding a particle to a surface. The method consists of a high velocity jet of liquid sweeping across a surface at pressures of 100 to 4,000 psi. The main advantage of high pressure jet scrubbing is that it is able to remove microscopic debris from difficult surface geometries such as depressions and circuit corners.

Etching is one of the most common cleaning methods used. It is a chemical cleaning method that consists of dissolving unwanted substances on a surface and is not as severe to the surface as a mechanical means of surface treatment. Etching is closely related to acid cleaning and is one of the most important procedures in micro-electronic device fabrication. Etching is performed as a sequential purification process in which oxidation and dissolution of residual or organic impurities in certain metal contaminants occurs in a mixture of water, hydrogen peroxide and ammonia peroxide. A solution of hydrogen peroxide and hydrochloric acid is used to remove heavy metals and to prevent displacement replating from solution by forming soluble complexes with the resulting ions. These solutions are chosen because they are completely volatile. They are also less hazardous than other possible cleaning mixtures and present no disposal problems. This method works because at a high pH, hydrogen peroxide solutions are effective at removing organic contaminants by oxidation and at a low pH they are effective at desorbing metal contaminants by complexing. This technique is particularly useful in cleaning silicon device wafers, quartz tubes, and parts used in semiconductor processing.

Centrifugal spray cleaning is an effective cleaning alternative to chemical immersion processes. It is commonly used for cleaning wafers. The wafers are enclosed in a sealed chamber purged with nitrogen. As the wafers spin, they are subjected to a series of continuous fine sprays of reagent solutions, including a hot aqueous solution of hydrogen peroxide and ammonium hydroxide, an aqueous solution of hydrochloric acid and hydrogen peroxide, and high purity water. Recontamination is prevented by arranging the sprays so that each wafer is continuously exposed to fresh solutions. Wafers are sprayed at 2,500 psi. After the wafers have been sprayed, they are dried with nitrogen. Centrifugal spray cleaning relies on centrifugal force, shear force and solvency.

A commercial apparatus for cleaning semiconductor wafers is disclosed in U.S. Pat. No. 4,186,032, issued to Ham. In this device, super-heated steam is passed over the surface of the wafer, the condensate being permitted to form and drip off the wafer and drying being accomplished by heating a chamber to a temperature in excess of 100° C. Note that this apparatus is limited to cleaning loose foreign surface matter and chemical impurities.

The following chart presents the current state of the art of methods for surface particle removal:

| METHOD | CLEANING MECHANISM | LOWER LIMIT PARTICLE SIZE | GENERAL CHARACTERISTICS |
|---|---|---|---|
| ultrasonic | cavitation | 25 microns | frequency range of 18 to 100 kilohertz; may damage surface |
| megasonic | high pressure waves | 0.2 microns | frequency range eight-tenths to one megahertz; 15 minutes duration |
| wiping | sheer | 5 microns | time-consuming |
| brush scrubbing | mechanical and sheer | 0.5 microns | does not work well on hydrophilic surface |
| low pressure spray | mechanical and detergency | 0.2 microns | pressure range of 5 to 80 pounds per inch; relatively time-consuming |
| high pressure spray | sheer | 0.2 microns | pressure range of 100 to 4,000 pounds per square inch; relatively slow; can damage surface |

Each of the cleaning methods heretofore discussed has required either the use of an active mechanical component, the use of special chemical solutions, or labor intensive human participation in order to achieve a satisfactory level of effectiveness. Furthermore, each cleaning method discussed is limited to a particular class of media to be cleaned, and, given the stringent requirements of certain industries, the absolute cleaning effectiveness of each method is not yet at a uniform, commercially acceptable level.

SUMMARY OF THE INVENTION

Our invention is intended to remove particles that reside on the surfaces of solid objects or which may be suspended in liquid solutions. The invention is particularly applicable to the semiconductor and computer industries where cleanliness is of the utmost importance in the manufacturing of such devices as semiconductor integrated circuit chips, disk drives, and other sophisticated electrical or mechanical components.

For example, in the manufacture of semi-conductor wafers, the current yield in commercial operations is often only on the order of 20-30%. A yield of 50% would be considered quite high. A major reason for the low yield in commercial semi-conductor wafer manufacture is the inability to achieve uniform and consistent cleanliness during the manufacturing process. For example, on many semi-conductor devices, the dimensions between adjacent paths of the circuit may be only on the order of one micron, and can often go as low as 0.25 microns in some experimental devices. A human hair typically has a diameter of 70 microns, and so one may readily realize that even the smallest particles may become lodged in integrated circuitry devices and thereby cause irreparable damage.

The invention also has applications in the manufacturing of precision optical components such as mirrors, lenses, lasers and other components whose surfaces must be kept clean to prevent a scattering of light and the degradation of performance. Other applications of the invention may be found in the pharmaceutical and biotechnology industries where particulate matter must be removed from surfaces or liquids during the manufacturing process. The mineral processing industry is another field where particulate matter must frequently be separated from the liquid in which the particles are suspended.

Accordingly, the present invention discloses novel methods and apparatus for cleaning surfaces and fluids.

In one embodiment, the surface to be cleaned, such as a silicon or gallium arsenide semiconductor wafer used in the manufacture of semiconductor integrated circuit chips, is immersed in a liquid, such as water housed in a vessel. A gas, such as carbon dioxide, is then introduced into the vessel and the pressure of the gas is increased. The gas will dissolve in the liquid, with the amount of gas dissolved increasing with increasing pressure. By increasing the gas pressure to a sufficiently high level, a given amount of the gas can be caused to dissolve in the liquid. After some time has elapsed, during which time the gas has dissolved into the liquid, a valve in the vessel is opened, substantially instantaneously, in order to relieve the gas pressure. The sudden drop in gas pressure causes the dissolved gas in the liquid to form bubbles. Since the formation of a gas bubble in the liquid will require a nucleus around which a gas can form, particles immersed in the liquid will serve as nuclei for bubble formation. As bubbles form around the particles in the liquid and grow in size, the buoyant force will increase. Eventually the bubble will detach from the surface and ascend in the liquid, carrying the particle with it to the top of the liquid surface. By this means, the particles will be detached from the surface of the object to be cleaned and congregate at the surface of the liquid.

DETAILED DESCRIPTION OF THE PREFERRED EMBODIMENTS

Figure 3:
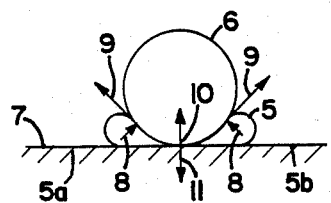
FIG. 3 is a schematic diagram illustrating bubble formation under a particle according to the principles of the present invention.
Figure 4:
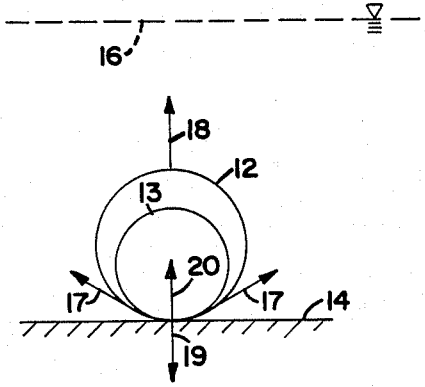
FIG. 4 is a schematic diagram illustrating bubble formation around the particle according to the principles of the present invention.
Figure 6:
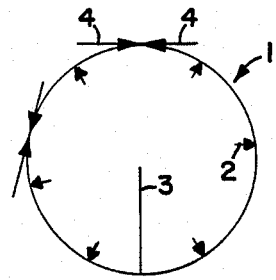
FIG. 6 is a schematic diagram showing forces acting on a gas bubble as utilized in the present invention.

The relevant fluid dynamics relationships utilized by the present invention can best be visualized by reference to FIGS. 3, 4 and 6. Referring particularly to FIG. 6, the relationship between bubble size and gas pressure can be discerned. The gas bubble shown generally at 1 is internally supported by a uniform pressure, signified by arrows 2, having a value of p. The bubble 1 has a radius 3, having a value of r. The size of the bubble 1 is constrained by the action of surface tension forces 4, having a value of f, which are uniformly exerted on bubble 1 by the liquid in which bubble 1 resides. Normally, the pressure p exerted by the gas inside the bubble 1 will be at equilibrium with the surface tension forces f exerted by the liquid, and the bubble 1 will have a constant radius r. The bubble 1 will grow in size only when the pressure force is higher than the surface tension force. The minimum value of p which must be achieved in order to achieve bubble growth is given by the equation:

$$p\pi r^2 = 2\pi r f$$

where r is the radius of bubble 1 and f is the surface tension of the liquid. By rearranging the terms of equation 1, the value of p is given by the equation:

$$p = \frac{2f}{r} = \frac{4f}{d}$$

where d is the diameter of the bubble 1. Equation 2 also permits calculation of the diameter of the particle around which the gas bubble 1 can form. Table 1 shows the values of particle diameter d and pressure p for bubble formation within liquid water, where f equals 72 dynes per centimeter.

TABLE I

| RELATIONSHIP BETWEEN PARTICLE DIAMETER (d) AND GAS PRESSURE (p) FOR BUBBLE FORMATION | |
|---|---|
| d (micrometers) | p (psi) |
| 10.00 | 8.4 |
| 1.00 | 84.0 |
| 0.10 | 840.0 |
| 0.05 | 1,680.0 |

The actual mechanism of particle formation is best viewed with reference to FIGS. 3 and 4. In FIG. 3, a single bubble 5, having a left lobe 5a and a right lobe 5b, is seen to first form in the space between the particle 6 and the surface 7. The relatively high gas pressure within the bubble then pushes the particle 6 away from the surface 7, thereby overcoming the adhesion force between the particle and the surface. The pressure force, p, is shown by arrows 8. In addition to the pressure forces 8, there is also the surface tension forces, f, shown by arrows 9 which act tangentially to the surface of particle 6 and which also act in a direction that would tend to lift the particle 6 away from surface 7. By this means, the particle 6 is detached and removed from the surface 7 by means of resultant force 10 acting to overcome the adhesion force 11.

A second mechanism of bubble formation is shown in FIG. 4, where a bubble 12 first forms around a particle 13. The particle 13 then attaches itself to the bubble 12, the particle 13 becoming separated from the surface 14 as the bubble 12 detaches itself from the surface 14 and rises within the liquid. In either mechanism, the particle is separated from the surface (7 or 14) and carried by the bubble (6 or 12) to the surface (15 or 16) of the liquid. Note that in FIG. 4, the surface tension force 17 (which creates a resultant force 20) assists in transmitting the buoyant force 18 to particle 13, thereby overcoming surface adhesion force 19.

The precise manner in which bubbles form in a liquid will vary depending on the surface tension of the liquid and the surface properties of the particle. A hydrophobic particle surface will probably cause the bubble to form differently than a hydrophilic particle surface. However, regardless of the manner in which the bubble is formed, the force exerted by the bubble on the particle will be high enough to cause the particle to be separated from the surface, provided, of course, that a sufficiently high initial gas pressure is used.

Figure 1:
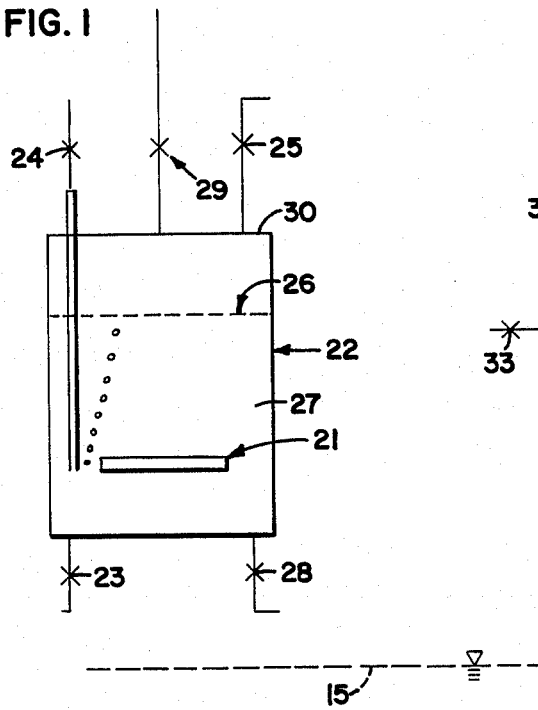
FIG. 1 is a schematic drawing of an apparatus for surface cleaning constructed according to the principles of the present invention.
Figure 2:
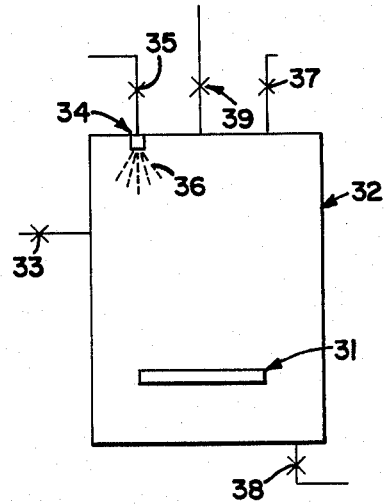
FIG. 2 is a second embodiment of an apparatus constructed according to the principles of the present invention.
Figure 5:
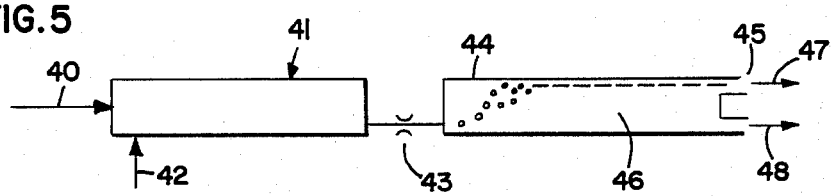
FIG. 5 is a schematic diagram of a liquid cleaning system constructed according to the principles of the present invention.

Apparatus suitable for exploiting these relationships to accomplish the cleaning of a surface or a liquid is shown in FIGS. 1, 2 and 5. Referring particularly to FIG. 1, an apparatus is shown which may be useful for cleaning an article 21, such as a wafer or a magnetic memory disk as used in computers. The article 21 is first placed in a pressure vessel 22. Deionized and filtered water or some other suitable cleaning fluid is then introduced into the vessel 22 through valve 23 until the article 21 is completely submerged. A gas under pressure, such as carbon dioxide, is then bubbled through the liquid by opening a valve 24 until the desired pressure is reached. The system is allowed to operate until a sufficient amount of gas is dissolved in the liquid. Pressure relief valve 25 is then quickly opened, reducing the pressure in the vessel and allowing bubbles to form around the particles to lift the particles away from the surface of article 21. The liquid 27 may then be drained through valve 28, carrying away the particles which are now suspended in the liquid 27. If the article 21 needs to be dried, dry nitrogen, air or some other gas can be admitted into the vessel 22 by opening valve 29 until the water or cleaning fluid has evaporated. The vessel cover 30 can then be opened and the article 21 removed.

In the apparatus shown in FIG. 2, the part 31 to be cleaned is first placed in a vessel 32. The system is first pressurized by opening valve 33 until the vessel 32 is completely filled with a gas, such as carbon dioxide, until the desired pressure is reached. Next, deionized and filtered water or some other suitable cleaning fluid is sprayed into the vessel through the spray nozzle 34, which may be accomplished by opening valve 35. By spraying the fluid into the vessel, numerous droplets 36 are formed. As the droplets 36 fall through the gas, the gas is dissolved. In this way the rate of dissolution of the gas into the liquid is increased. After enough liquid has been sprayed into the vessel 32 and the part 31 to be cleaned is completely covered by the liquid, valve 37 is opened, suddenly reducing the gas pressure in the vessel 32 and allowing bubbles to form around the particles. After the particles have been lifted away by the bubbles, the liquid is drained by opening valve 38 and dry air or nitrogen is introduced into the vessel 32 via valve 39 to dry the part 31.

In addition to the use of the invention for removing particles from surfaces, the invention can also be used to remove particles suspended in a liquid. For particle removal from a liquid, the liquid will be placed in a vessel and subjected to high gas pressure. A valve will then be opened and the gas pressure caused to drop quickly to some ambient condition. As the bubbles form in the liquid around the particles and rise to the surface, they will carry the particles with them to the surface where they can be separated from the clean liquid remaining below.

An apparatus for achieving this goal in a continuous process is shown in FIG. 5. A liquid containing suspended particulate matter is represented by arrow 40. The liquid enters a vessel 41, along with a gas under pressure, the gas being represented by arrow 42. As the mixture of liquid 40 and gas 42 flows through the pressure vessel, the gas 42 is dissolved in the liquid 40. The liquid 40 is then allowed to expand through a restricting orifice 43. As the liquid 40 flows through the restricting orifice 43, the pressure exerted between liquid 40 is suddenly reduced, causing bubbles 44 to form in the liquid 40. The bubbles 44 then rise to the upper portion 45 of the flowing liquid stream 46, the contaminant particles being transported within the bubbles 44. The stream 46 can then be separated into an upper stream 47 and a lower stream 48, the upper stream 47 being removed by some conventional method and the relatively clean liquid within lower stream 48 can be discharged separately.

The present invention is not restricted to the use of water as the cleaning liquid or the use of carbon dioxide as the gas. Other liquids, such as fluorocarbons, acids, solvents, etc., can also be used. Gases such as nitrogen, oxygen, argon, helium and others would also be suitable and can be advantageous under some circumstances. In general the gas used must have suitable solubility characteristics in the liquid. Its physical and chemical properties must also be compatible with the liquid and the surface to be cleaned.

In particular, it may be desirable to use a single substance such as a fluorocarbon of a suitable vapor pressure/temperature relationship, in which case, the substance would first be pressurized to form a liquid into which the surface is placed. The pressure is then quickly reduced. As the liquid vaporizes, bubbles form around the particles causing them to be lifted from the surface. In some instances, the pressure can be raised sufficiently until the critical point of the substance is exceeded, thereby forming a "super critical fluid". As the pressure is reduced, the bubbles form as just described so as to lift the particles from the surface.

Figure 9:
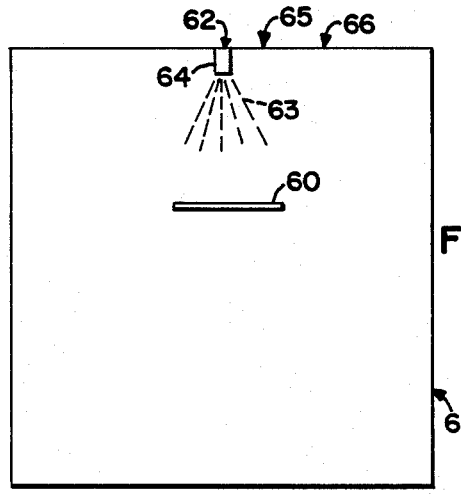
FIG. 9 is a schematic view depicting the adhesion distance between a particle and a surface during a phase change.

An alternate method of cleaning particles from a surface may be accomplished by utilizing the effect of a phase change on the adhesion force between a particle and a surface. In particular, the process of particle removal from a surface by freezing and melting a thin layer of water on the surface has been found to be, through laboratory experiment, quite effective. The specific mechanism involved is related to the expansion of water during the breathing process. As shown in FIG. 9A, a particle 56 is adjacent to surface 57, the particle being immersed in a thin film of water 58. Current adhesion theory predicts that a particle having a radius of 500 angstroms will be suspended from the surface 57 by a distance of four angstroms.

However, as shown in FIG. 9B, as the water 58 freezes, thereby becoming ice, the volume occupied by the water expands, causing the particle 56 to move away from surface 57, thereby greatly increasing the separation distance between the particle 56 and the surface 57. In particular, the distance increases from four angstroms to a distance of 49 angstroms, thereby greatly reducing the adhesion force between the particle and the surface. The reduction and adhesion force allows the particle to be removed from the surface 57 with relative ease.

Figure 8:
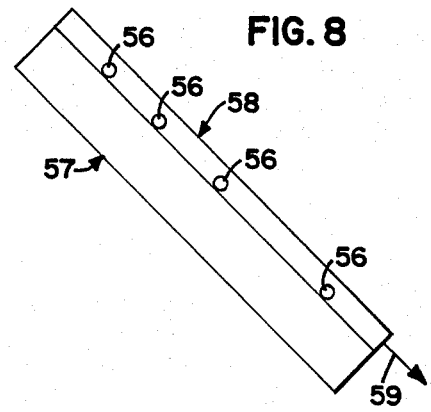
FIG. 8 is a cross-sectional view depicting the mechanics of particle removal as utilized by the method depicted in FIG. 7.

A more general view of this process as applied to cleaning a surface is shown in FIG. 8. In this case, the surface 57 is coated with a plurality of particles 56, which are then coated with a layer of water 58. As the water 58 becomes ice, the particles 56 are entrapped within the ice. If the surface 57 is then heated from below, the ice sheet 58 will slide away from the surface in the direction of arrow 59, thereby carrying the entrapped particles with the ice sheet 58 and removing them from the surface 57.

In some cases, the gas utilized may be placed under a sufficiently high pressure so as to exceed the critical pressure of the gas or the liquid. Liquids and gases in such a super critical state would be particularly suitable for cleaning very small particles or particles that adhere very strongly to surfaces. The specific conditions under which such super critical fluids can be used will vary according to the liquid, gas and surface involved.

Figure 7:
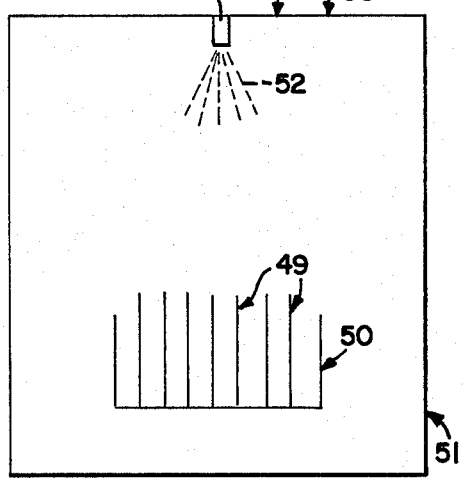
FIG. 7 is a schematic diagram depicting an alternate method and apparatus for cleaning wafer surfaces.

An apparatus embodying this alternate method of cleaning is depicted in FIG. 7. In this embodiment, the wafers 49 are supported on wafer carrier 50, the wafer carrier 50 being housed within a suitable chamber 51. The first step in the cleaning process involves spraying water 52 into chamber 51 via nozzle 53.

The wafers 49 may be submerged in the water 52, but preferably, rather than submerging the wafers 49 in the water 52, the water 52 is applied only to the extent necessary to coat the surface of the wafers, thereby forming a thin layer of liquid on the wafer surface. The surface of the wafer 49 is then cooled below the freezing point of water by injecting into the chamber a gas 54, such as cold air or nitrogen, which is below the freezing temperature of water 52. The circulation of gas 54 through the chamber 52 causes the layer of water 52 on the surface of wafers 49 to freeze.

As the water 52 freezes, the volume occupied by the water increases, thereby pushing any particles which may reside on the surface of wafer 49 away from the surface. This lessens the adhesion force between the surface of wafer 49 and the undesired particle, thereby decreasing the resistance of the particle to removal from the surface.

Once the freezing process is completed, the surface of the wafer 49 may be heated, causing the thin layer of ice to slide away from the surface, carrying the particles with it. An alternate method of removing the ice would simply require that warm water be sprayed on the wafer surface, and the particles would be flushed away with the melting ice. For example, as shown in FIG. 7, the temperature of water 52 could be elevated, melting the ice and flushing away the particles. Finally, a gas 55, such as air or nitrogen, could be introduced into the chamber to evaporate the water and dry the wafer surface. Experiments involving this cleaning method have shown a cleaning efficiency of 90%, that is, removal of 90% of the undesired particles from the wafer surface.

Many other methods may be used to accomplish the objectives of this novel cleaning method. For example, the wafer 49 could be heated by microwave energy, other electromagnetic radiation, infrared heating, warm air, or other warm gases, or the heating step could be eliminated altogether. In the non-heating method, the freezing cycle could simply be repeated until the ice broke away from the surface of the wafer. Specifically, a thin layer of water could be frozen on the surface as before, the surface temperature could then be gradually reduced to a sufficiently low level until the ice became separated from the surface as a result of the difference in the coefficients of thermal expansion of the ice and the substrate surface material. In this way, the entrapped particles are removed without having to first melt the ice.

The phase change cleaning method just described involves, in the preferred embodiment, changing the water (liquid phase) to ice (solid phase) and then back to water (liquid phase). In some applications, other substances can also be used. Examples of alternate substances include methanol, ethanol and various alcohols, organic chemical compounds such as fluorocarbons and hydrocarbons, and any other substance which can be frozen and melted in a manner similar to water. Also, some agitation or spinning of the wafers might facilitate the cleaning method.

Figure 10:
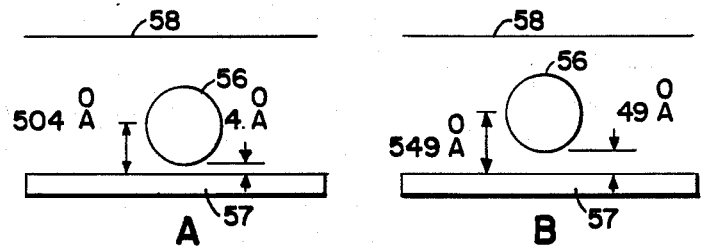
FIG. 10 is a schematic diagram of an apparatus for cleaning a single wafer using the method depicted in FIG. 7.

Various other apparatus may be useful in carrying out the method described herein. For example, FIG. 10 shows a schematic diagram of a system in which a single silicon wafer 60 is placed in a chamber 61. A source of water 62 supplies a spray 63 via nozzle 64. Cold air, nitrogen or some other gas 65 is introduced into the chamber 61 until the water on the wafer surface freezes. Warm water is then sprayed onto the surface causing the ice to melt. The water is then drained from the chamber 61 and dry air nitrogen or some other suitable gas 66 is then introduced into the chamber to evaporate the water and dry the surface. Cooling of the gas used to freeze the water on the surface can be done by mechanical refrigeration, or by passing gaseous nitrogen through a chamber containing liquid nitrogen until the temperature is reduced sufficiently to cause the freezing of water.

Figure 11:
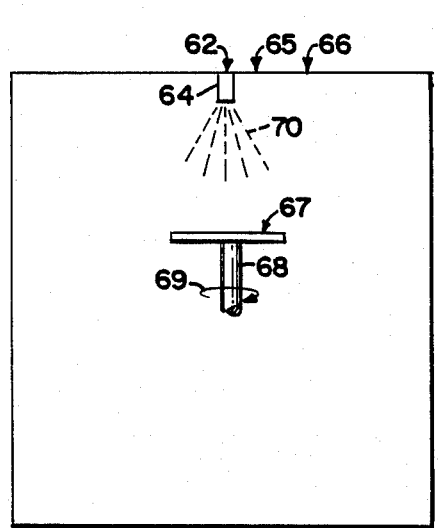
FIG. 11 is a schematic diagram of a system for cleaning a wafer utilizing a spindle.

An alternate embodiment for carrying out the same process is shown in FIG. 11. In this method, the wafer 67 is placed on a spindle 68 and rotated (as shown by arrow 69) while water 70 is sprayed onto the wafer 67. This causes only a thin layer of water to form on the surface of wafer 67. This water layer is then frozen, melted and dried as described before.

Figure 12:
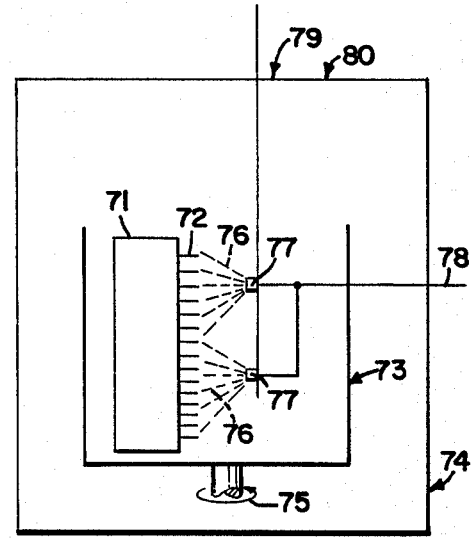
FIG. 12 depicts a method of cleaning a cassette of wafers utilizing a rotating spindle.

Another embodiment of an apparatus utilizing the method described herein is depicted in FIG. 12. In this apparatus, wafer cassettes 71 house individual wafers 72. The wafer cassette 71 resides within a cassette bin 73 which in turn is housed within chamber 74. The cassette bin 73 is caused to rotate as shown by the direction of arrow 75 while water 76 is sprayed onto the wafers 72. A plurality of nozzles 77 may be connected to any suitable liquid source 78. Freezing of the water may be accomplished by a suitable gas 79, and melting accomplished by injection of another suitable gas 80 within chamber 74.

The invention is not to be limited to the specific construction or arrangement of parts shown, but the devices and methods as described above may be widely modified within the scope of the invention.

The above described method is not limited to cleaning semi-conductor wafers alone. It can be used to clean many surfaces, including computer disk drive surfaces, plastic wafer carriers, precision mechanical, electrical and optical parts, all of which can be readily cleaned by the methods described.

In applying the water to the surface according to the method disclosed, the water must actually wet the surface to be cleaned. If wetting is incomplete, air bubbles could be entrapped between the liquid and the surface, thereby resulting in incomplete cleaning. However, this can be easily remedied by adding a small amount of a surface active agent such as detergent to improve the wettability of the surface. Other chemicals, such as an acid, can also be added to both improve the wettability of the surface and to remove other surface contaminants while undergoing particle removal by the process described.

We claim:

1. A system for cleaning a surface, comprising:
   (a) a pressure vessel, the pressure vessel being suitably configured so as to house the surface;
   (b) a cleaning fluid within the pressure vessel of sufficient depth such that the surface is submerged in the cleaning fluid;
   (c) means for introducing a gas into the cleaning fluid so as to achieve a desired pressure within the pressure vessel, wherein the desired pressure is dependent upon the gas, the surface and the cleaning fluid;
   (d) a pressure relief valve movable between a first open position and a second closed position, wherein movement of the valve from the closed position to the open position causes a substantially instantaneous decrease in the desired pressure within the pressure vessel such that bubbles spontaneously form within the cleaning fluid, the bubbles tending to form around contaminants on the surface, the bubbles tending to remove the contaminants from the surface and suspend the contaminants within the cleaning fluid; and
   (e) a drain, the drain permitting the cleaning fluid to be removed from the pressure vessel, thereby simultaneously removing the suspended contaminants from the pressure vessel such that a relatively clean surface remains within the pressure vessel.

2. The system of claim 1, wherein the cleaning fluid is deionized and filtered water.

3. The system of claim 1, wherein the gas is carbon dioxide.

4. The system of claim 1, wherein the gas is compressed air.

5. The system of claim 1, wherein the gas is nitrogen.

6. The system of claim 1, wherein the gas is a mixture of carbon dioxide and air.

7. The system of claim 1, wherein the gas is a mixture of carbon dioxide and nitrogen.

* * * * *